United States Patent
Jiang et al.

(10) Patent No.: US 6,797,633 B2
(45) Date of Patent: Sep. 28, 2004

(54) IN-SITU PLASMA ASH/TREATMENT AFTER VIA ETCH OF LOW-K FILMS FOR POISON-FREE DUAL DAMASCENE TRENCH PATTERNING

(75) Inventors: Ping Jiang, Plano, TX (US); Robert Kraft, Plano, TX (US); Kenneth J. Newton, McKinney, TX (US); Daty M. Rogers, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 70 days.

(21) Appl. No.: 09/966,605

(22) Filed: Sep. 28, 2001

(65) Prior Publication Data

US 2002/0081855 A1 Jun. 27, 2002

Related U.S. Application Data

(60) Provisional application No. 60/255,715, filed on Dec. 14, 2000, provisional application No. 60/255,714, filed on Dec. 14, 2000, provisional application No. 60/250,241, filed on Nov. 30, 2000, and provisional application No. 60/247,562, filed on Nov. 9, 2000.

(51) Int. Cl.$^7$ ............................................. H01L 21/302
(52) U.S. Cl. ....................... 438/706; 438/710; 438/712; 438/720
(58) Field of Search .................................. 438/637, 638, 438/640, 706, 700, 710, 712, 720, 725, 760, 766

(56) References Cited

U.S. PATENT DOCUMENTS

| | | | | |
|---|---|---|---|---|
| 6,042,999 A | * | 3/2000 | Lin et al. ..................... | 430/316 |
| 6,166,439 A | * | 12/2000 | Cox ............................. | 257/758 |
| 6,232,237 B1 | * | 5/2001 | Tamaoka et al. ............ | 438/725 |
| 6,316,354 B1 | * | 11/2001 | Hu .............................. | 438/652 |
| 6,342,448 B1 | * | 1/2002 | Lin et al. ..................... | 438/687 |
| 6,350,701 B1 | * | 2/2002 | Yamazaki .................... | 438/732 |
| 6,380,096 B2 | * | 4/2002 | Hung et al. ................. | 438/723 |
| 6,455,431 B1 | * | 9/2002 | Hsieh et al. ................. | 438/691 |

* cited by examiner

Primary Examiner—Lan Vinh
(74) Attorney, Agent, or Firm—Jacqueline J. Garner; W. James Brady, III; Frederick J. Telecky, Jr.

(57) ABSTRACT

After via etch, a low-k dielectric layer (104) is treated with an in-situ $O_2$ plasma. Resist poisoning is caused by a N source that causes an interaction between low-k films (104), such as OSG, and DUV resist (130, 132). The in-situ plasma treatment immediately removes the source of poisoning to reduce or eliminate poisoning at trench patterning.

15 Claims, 1 Drawing Sheet

IN-SITU PLASMA ASH/TREATMENT AFTER VIA ETCH OF LOW-K FILMS FOR POISON-FREE DUAL DAMASCENE TRENCH PATTERNING

CROSS-REFERENCE TO RELATED APPLICATIONS

The following co-pending applications are related and hereby incorporated by reference:

| Ser. No. | Filing Date | Inventors |
| --- | --- | --- |
| 60/247,562 | Nov. 9, 2000 | Jiang et al. |
| 60/250,241 | Nov. 30, 2000 | Eissa et al. |
| 60/255,715 | Dec. 14, 2000 | Kirkpatrick et al. |
| 60/255,714 | Dec. 14, 2000 | Kirkpatrick et al. |

FIELD OF THE INVENTION

The invention is generally related to the field of forming interconnect layers in a semiconductor device and more specifically to patterning low-k dielectric films.

BACKGROUND OF THE INVENTION

As the density of semiconductor devices increases and the size of circuit elements becomes smaller to achieve better performance, the resistance capacitance (RC) delay time in back-end-of-line (BEOL) increases and dominates the circuit performance. To reduce the RC delay time at BEOL, the demands on interconnect layers for connecting the semiconductor devices to each other also increase. Therefore, there is a desire to switch from the traditional aluminum metal interconnects to copper interconnects and from traditional silicon-dioxide-based dielectrics to low-k dielectrics, such as organo-silicate glass (OSG). Semiconductor fabrication processes for working with the copper interconnects and newer low-k dielectrics are still needed.

As compared to the traditional subtractive plasma dry etching of aluminum, suitable copper etches for a semiconductor fabrication environment are not readily available. To overcome the copper etch problem, damascene processes have been developed. In a damascene process, the IMD (intra-metal dielectric) is formed first. The IMD is then patterned and etched to form trenches for the interconnect lines. If connection vias have not already been formed, a dual damascene process may be used. In a via-first dual damascene process, an ILD (interlevel dielectric) is deposited first, followed by an IMD deposition. An IMD etch-stop layer, such as SiN, can be optionally used in between IMD and ILD. A via is patterned and etched through the IMD and ILD for connection to lower interconnect levels. Then a trench is patterned and etched in the IMD. A barrier layer and a copper seed layer are then deposited over the structure. The barrier layer is typically tantalum nitride or some other binary transition metal nitride. The copper layer is electrochemically deposited (ECD) using the seed layer over the entire structure. The copper is then chemically-mechanically polished (CMP'd) to remove the copper from over the IMD, leaving copper interconnect lines and vias. A metal etch is thereby avoided.

When low-k dielectrics such as OSG are used for the IMD and ILD, a problem known as resist poisoning occurs. Resist poisoning occurs during a patterning step such as via pattern or trench pattern. It is a result of the interaction between a DUV (deep ultra-violet) resist and low-k films. Resist poisoning causes poor resist sidewall profiles, resist scumming, large CD variations, and requires a large resist exposure dose. Furthermore, the required resist exposure dose to achieve the target CD becomes too high and varies with film aging. A process to reduce or eliminate resist poisoning in low-k dielectrics is therefore desired.

SUMMARY OF THE INVENTION

The invention is an in-situ plasma treatment for low-k films that improves patterning. After via etch, the wafer with a low-k film is treated with a plasma, such as an $O_2$ plasma, to eliminate or significantly reduce resist poisoning. The plasma treatment may be performed in the same chamber or a separate chamber if the transfer is performed under vacuum. After plasma treatment, the trench patterning is performed.

An advantage of the invention is providing a treatment to reduce or eliminate resist poisoning of low-k dielectric films.

This and other advantages will be apparent to those of ordinary skill in the art having reference to the specification in conjunction with the drawings.

DETAILED DESCRIPTION OF THE EMBODIMENTS

The invention will now be described in conjunction with dual damascene copper interconnect process. It will be apparent to those of ordinary skill in the art that the benefits of the invention may be applied generally to patterning of low-k (k<3.0) and ultra-low-k (k<2.5) films.

Figure 1A:
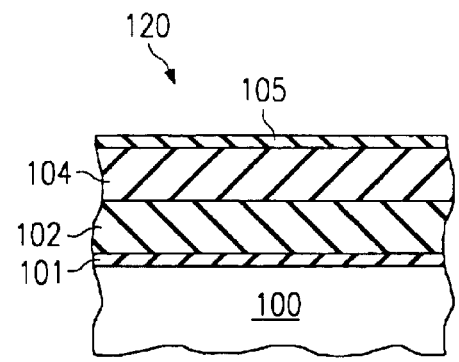
FIGS. 1A–1F are cross-sectional diagrams of a process for forming metal interconnects according to the embodiments of the invention.

In order to form the copper interconnects using a dual damascene process, the interlevel dielectric (ILD 102) and intra-metal dielectric (IMD 104) of FIG. 1A are patterned and etched to form trenches in IMD 104 and vias in ILD 102. When low-k or ultra low-k materials are used for the ILD and IMD, an interaction between the resist and the low-k materials causes resist poisoning. The cause of resist poisoning is believed to be the interaction between the DUV resist and nitrogen-containing reagents from the low-k films. Possible sources of nitrogen include: the low-k film, the dielectric cap and optional IMD etch-stop layers (e.g., SiN) and/or chemistries used in the deposition of these films, $N_2$ in the clean (ash) process, $N_2$ in the etch chemistry, and the photoresist itself.

In order to reduce or eliminate the resist poisoning, an in-situ plasma ash and treatment is performed. In the preferred embodiment, an $O_2$ plasma is used. Alternatively, other plasma chemistries such as $H_2$, $H_2O$, $H_2O_2$, $O_3$, CO, $CO_2$, $SO_2$, etc. may be used with or without gas additives like Ar or He.

As an example, the following $O_2$ plasma process may be used in a TEL DRM plasma reactor with dual chambers. Organo-silicate glass (OSG) is used as the ILD/IMD. After via etch in one chamber, the wafer is transferred immediately (under vacuum) to the other chamber for the following ash/treatment process:

| |
|---|
| Time: 40 sec. |
| Pressure: 150 mT |
| Power: 400 W |
| Flow: 400 sccm $O_2$ |
| Chuck Temp.: 40° C. |

Using the above process parameters, a resist ash rate of 9000 Å/min can be achieved. The OSG etch rate is 110 Å/min.

The plasma process conditions are designed to strip off the resist and remove nitrogen adsorbed on the resist and via sidewalls as well as in the dielectric film. Therefore, resist poisoning is prevented. The duration of the plasma treatment is highly dependent on the amount of nitrogen from the various nitrogen sources to be removed. For example, if a SiN capping layer is used, the duration of the plasma process may need to be increased.

An embodiment of the invention will now be discussed with reference to FIGS. 1A–1F. A semiconductor body 100 is processed through the formation of a first interconnect layer. Semiconductor body 100 typically comprises a silicon substrate having transistors and other elements formed therein. Copper interconnect level may be the first or any subsequent metal interconnect level of the semiconductor device 120.

An etchstop layer 101 is deposited over the first interconnect layer. An ILD 102 is formed over etchstop layer 101. IMD 104 is formed over ILD 102. A trench etchstop layer (not shown) may optionally be placed between ILD 102 and IMD 104. ILD 102 and IMD 104 comprise low-k or ultra low-k dielectrics, such as organo-silicate glass (OSG), inorganic films and organic films. In the preferred embodiment, ILD 102 and IMD 104 comprise the same material. However, ILD 102 and IMD 104 may alternatively comprise different materials. A capping layer 105 may be formed over IMD 104 if desired. In the preferred embodiment, the capping layer comprises silicon carbide (e.g., BLok from Applied Materials). Alternatively, a silicon oxide, silicon nitride, silicon oxynitride (SiON), Si-rich nitride (SRN), or no capping layer may be used.

Figure 1B:
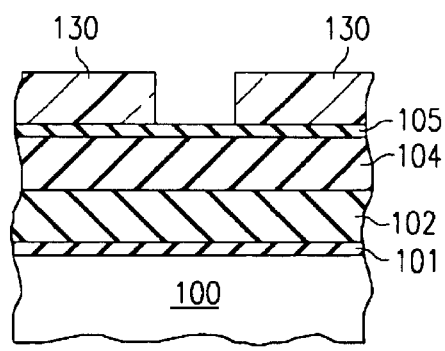
Figure 1C:
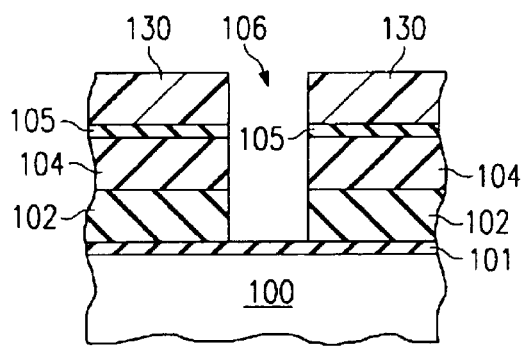

Referring to FIG. 1B, the via pattern 130 is formed over capping layer 105. The via 106 is then etched through IMD 104 and ILD 102, as shown in FIG. 1C.

After the via etch, an in-situ plasma ash/treatment is performed according to the invention. The plasma treatment may be performed in the same chamber as the via etch or in a separate chamber of the same tool. For example, the TEL DRM plasma reactor is available with dual chambers. One chamber may be used for the via etch, while the other chamber is used for the plasma ash/treatment. If a separate chamber is used, the wafers should be transferred under vacuum. Other RIE (reactive ion etching) etcher/ashers may alternatively be used.

An $O_2$ plasma is preferably used for the plasma treatment. However, other chemistries, such as those involving $H_2$, $H_2O$, $H_2O_2$, $O_3$, CO, $CO_2$, or $SO_2$, etc. with or without inert gases like Ar or He, may alternatively be used. Analysis of RIE $O_2$ plasma treated low-k films revealed some carbon depletion, but no significant damage to the OSG film. Care should be taken to limit oxidation so as not to damage the low-k film.

An advantage of the invention is improved throughput. The plasma treatment removes (ashes) the resist of via pattern 130 and functions as a wafer clean in addition to eliminating resist poisoning. Thus, the in-situ process reduces the overall via etch and clean time.

The plasma treatment should be performed immediately after the via etch. An advantage of the invention is that the source of poisoning (e.g., N that is adsorbed on the resist and via sidewall) is removed immediately after the etch. This minimizes the time that the wafers are exposed to the poisoning source and also prevents any poisoning reactions that may be enhanced by moisture exposure.

In order to protect the bottom of via 106 during the subsequent trench etch, via 106 may be partially or completely filled. For example, an organic BARC (bottom anti-reflection coating) 107 may be deposited over the structure and etched back such that BARC material remains only in the via 106.

Figure 1D:
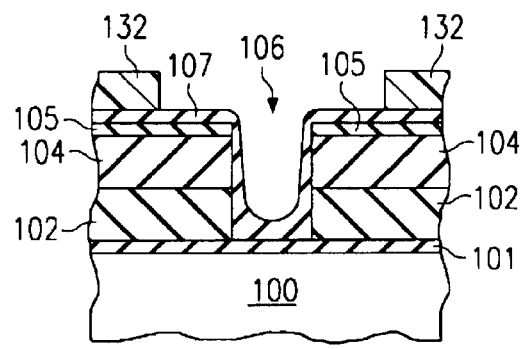

Next, a trench pattern 132 may be formed over IMD 104, as shown in FIG. 1D. An in-situ plasma ash/treatment after via etch reduces or eliminates the poisoning problem at trench pattern. With a $SiO_2$ capping layer 105 or no capping layer, both in-situ and ex-situ $O_2$ plasma ash show no resist poisoning. When a SiC capping layer 105 is used, a flood exposure after via clean shows a clear difference among in-situ $O_2$ plasma ash, ex-situ $O_2$ plasma ash and a $H_2$/Ar plasma ash. The exposure energy required to clear resist inside a via is the lowest for the wafer with in-situ $O_2$ plasma ash, indicating the most robustness for fighting poisoning.

Figure 1E:
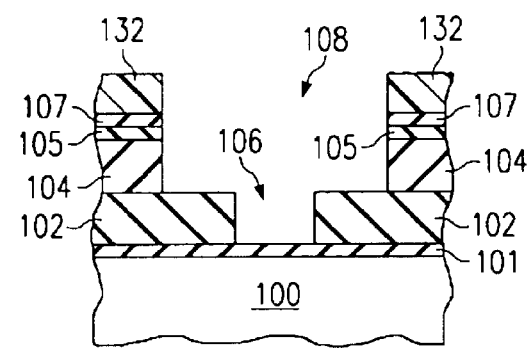

After trench pattern, a trench 108 is etched in IMD 104, as shown in FIG. 1E. Trench pattern 132 and BARC 107 are then removed. The capping layer 105 and etchstop layer 101 are removed next during an etchstop etch. Copper interconnect structures will subsequently be formed in trench 108 and via 106.

Barrier layer 110 is deposited over IMD 104 including in trench 108 and via 106. Barrier layer 110 functions to prevent copper diffusion into the ILD and IMD layers. Suitable barrier materials such as Ta/TaN are known in the art. A seed copper layer is then deposited over barrier layer 110.

Electrochemical deposition (ECD) may then be used to deposit copper layer 124. Various copper ECD processes are known in the art. In one example, a 3-step process is used. After placing the wafer in the plating solution, a current of approximately 0.75 Amps is passed through the seed layer for a time on the order of 15 seconds. The current is then increased to around 3 Amps for approximately 60 seconds. Final plating occurs at a current of about 7.5 Amps with the duration determined by the final desired thickness. A quick spin-rinse dry (SRD) is performed in the plating cell above the plating solution. The wafer is then transferred to the SRD cell and a post-ECD SRD is used to clean the plating residue.

Figure 1F:
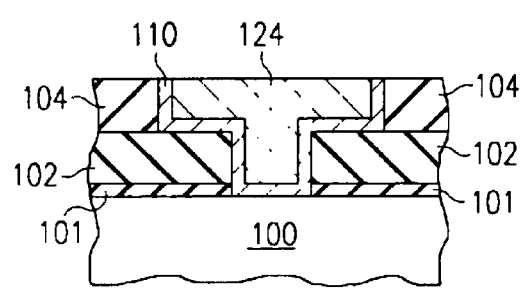

After copper ECD, the copper 124 and barrier 110 are chemically mechanically polished (CMP) to remove the material from above IMD 104. The resulting structure is shown in FIG. 1F. Next level ILD and IMD may be deposited and processing may then continue to form additional metal interconnect levels and package the device.

As a result of the plasma treatment according to the invention, the DUV pattern energy required to achieve the target CD (critical dimension) is reduced. In one experiment, a via was patterned on a wafer having a 1000 Å SiC cap. The IMD comprised OSG. The $O_2$ plasma process conditions were: pressure-45 mT, power-400 W, $O_2$ flow rate-400 sccm, and a chuck temperature of 40° C. The pattern energies required to achieve the target CD were as shown below:

| |
|---|
| OSG films with H₂/Ar ash: ~35 mJ/cm² |
| OSG films with ex-situ O₂ ash: ~30 mJ/cm² |
| OSG films with in-situ O₂ ash: ~25 mJ/cm² |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

In the claims:

1. A method for fabricating an integrated circuit, comprising the steps of:
   forming a low-k dielectric layer over a semiconductor body;
   forming a resist pattern over said low-k dielectric layer;
   etching said low-k dielectric layer using said resist pattern; and
   treating said low-k dielectric layer with a plasma having a bias power on the order of 400 W, wherein said treating step occurs in-situ with respect to said etching step.

2. The method of claim 1, wherein said plasma comprises $O_2$.

3. The method of claim 1, wherein said plasma comprises $H_2O$.

4. The method of claim 1, wherein said plasma comprises a gas selected from the group consisting of $O_2$, $H_2$, $H_2O$, $H_2O_2$, $O_3$, CO, $CO_2$, and $SO_2$.

5. The method of claim 1, wherein said low-k dielectric layer comprises organo-silicate glass.

6. The method of claim 1, wherein said low-k dielectric layer comprises an ultra-low-k dielectric layer having a dielectric constant less than 2.5.

7. The method of claim 1, wherein said treating step removes said resist pattern.

8. The method of claim 1, wherein said treating step occurs in the same chamber as the etching step.

9. The method of claim 1, wherein said treating said occurs in a separate chamber of a tool used for the etching step.

10. The method of claim 9, wherein said low-k dielectric layer is transferred under vacuum from an etching chamber after said etching step to said separate chamber.

11. A method of fabricating an integrated circuit having copper metal interconnects, comprising the steps of:
    forming an etchstop layer over a semiconductor body;
    forming an interlevel dielectric (ILD) over the etchstop layer;
    forming an intrametal dielectric (IMD) over the ILD;
    forming a capping layer over said MD
    forming a via resist pattern over said capping layer;
    etching a via in said IMD and ILD using said via resist pattern;
    removing said via resist pattern using a plasma treatment to reduce poisoning by a nitrogen source, wherein said plasma treatment occurs rn-situ with respect to said etching step and occurs under a bias power of approximately 400 W;
    at least partially filling said via with an orgaflic material;
    forming a trench resist pattern over said IMD;
    etching a trench in said IMD using said trench resist pattern;
    removing said trench resist pattern and said organic material in said via;
    removing said capping layer and any exposed portion of the etchstop layer; and
    forming a copper interconnect in said via and said trench.

12. The method of claim 11, wherein said plasma treatment compilses $O_2$.

13. The method of claim 11, wherein said plasma treatment comprises a gas selected from the group consisting of $H_2$, $H_2O$, $H_2O_2$, $O_3$, CO, $CO_2$, and $SO_2$.

14. The method of claim 11, wherein said plasma treatment occurs in the same chamber as the etching a via step.

15. The method of claim 11, wherein said plasma treatment occurs in a separate chamber of the same tool as the etching a via step.

* * * * *